United States Patent [19]

Kato

[11] Patent Number: 5,691,503

[45] Date of Patent: Nov. 25, 1997

[54] ELECTRO-MAGNETICALLY SHIELDED DOOR HINGE

[75] Inventor: Junichi Kato, Sunnyvale, Calif.

[73] Assignee: Hewlett-Packard Company, Palo Alto, Calif.

[21] Appl. No.: 332,627

[22] Filed: Oct. 31, 1994

[51] Int. Cl.$^6$ .................................................. H05K 9/00
[52] U.S. Cl. ........................................ 174/35 R; 220/334
[58] Field of Search ................................ 361/816, 818;
174/35 R, 35 MS; 16/221, 382, 386, 250,
251; 220/334, 335, 336, 337, 338, 339,
340

[56] References Cited

U.S. PATENT DOCUMENTS

| | | | |
|---|---|---|---|
| 2,332,017 | 10/1943 | Sedgwick | 220/31 |
| 3,653,758 | 4/1972 | Trimmer et al. | 355/16 |
| 4,111,546 | 9/1978 | Maret | 355/15 |
| 4,713,572 | 12/1987 | Bokowski | 310/323 |
| 4,759,466 | 7/1988 | Chase | 220/306 |
| 4,764,021 | 8/1988 | Eppes | 366/127 |
| 4,942,271 | 7/1990 | Corsi et al. | 174/101 |
| 4,987,456 | 1/1991 | Snelling et al. | 355/273 |
| 5,031,070 | 7/1991 | Hsu | 361/380 |
| 5,114,036 | 5/1992 | Liu | 220/307 |
| 5,189,257 | 2/1993 | Borgmeyer et al. | 174/50 |
| 5,191,544 | 3/1993 | Beneck et al. | 364/708 |
| 5,223,670 | 6/1993 | Hogan et al. | 174/35 MS |
| 5,262,588 | 11/1993 | Gallagher | 174/35 R |
| 5,278,351 | 1/1994 | Herrick | 174/35 R |

*Primary Examiner*—Hyung S. Sough
*Assistant Examiner*—Hung V. Ngo
*Attorney, Agent, or Firm*—Douglas M. Gilbert

[57] ABSTRACT

An electro-magnetically shielded metallic enclosure is provided with a novel hinge structure. The enclosure has a plurality of side panels and at least one access door hinged to one of the side panels by a plurality of shielded hinges. Each such hinge has three principal elements: a metallic tab, an elongated slot for receiving and supporting the metallic tab, and a raised metal arch bridging the central portion of the elongated slot. The metallic tab is integrally formed on one edge of the access door and is designed to slide into an elongated slot located in an adjacent side panel to provide support for pivoting the metallic tab and the connected door in a hinged relationship. To prevent EMR from otherwise leaking through the elongated slot, a raised metal arch is provided on the interior of the enclosure bridging the central portion of the slot. The arch is spaced apart from the inner surface of the side panel to permit the free end of the metallic tab to freely rotate when the access door is swung open and closed.

20 Claims, 5 Drawing Sheets

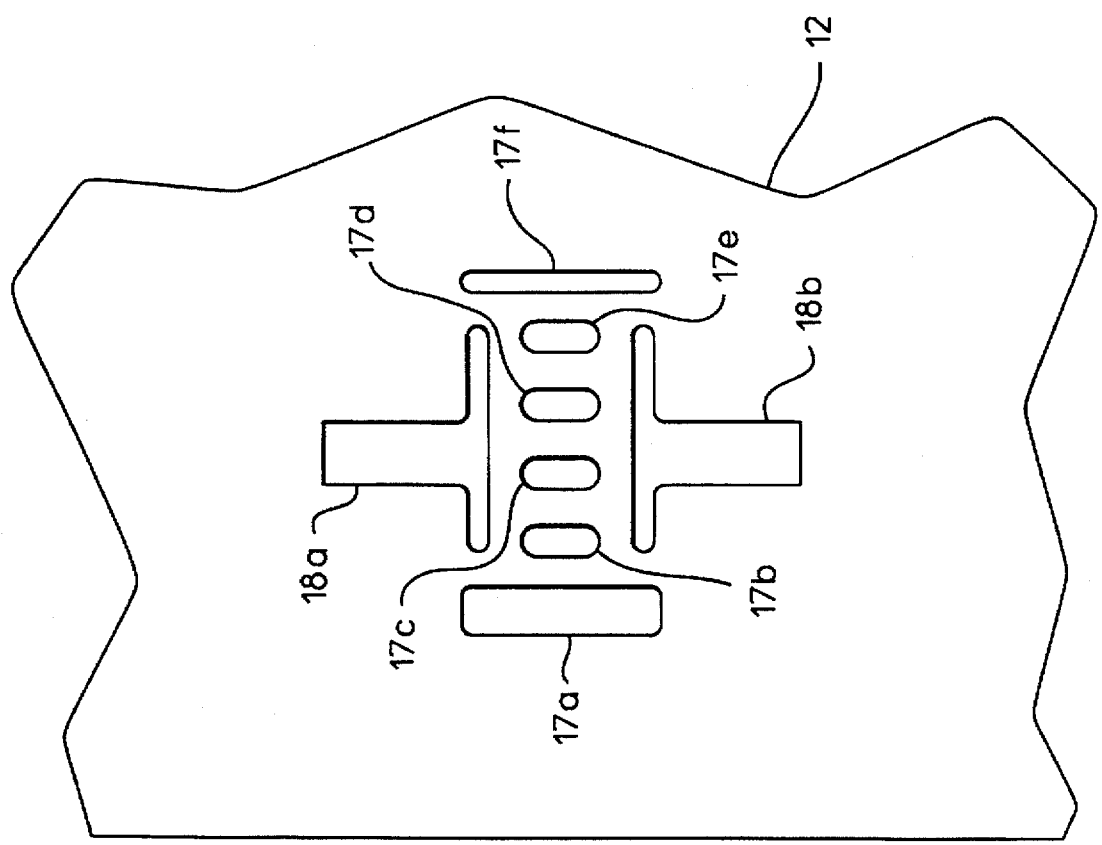

ELECTRO-MAGNETICALLY SHIELDED DOOR HINGE

BACKGROUND OF THE INVENTION

This invention pertains generally to electro-magnetic (EM) shielding of electronic devices, such as personal computers, and more particularly, to a novel shielded hinge structure for use in connection with access doors of a metallic enclosure.

As the operational speeds of computers and computer circuits have increased over the years, so has the electro-magnetic radiation (EMR) of components used in such computers and circuits. Increased levels of EMR is to be expected with higher frequency signals. At frequencies below a few 100 kHz component leads of a few millimeters act as simple to conductors, yet at frequencies above 50 MHz the same conductors become antennas radiating energy in all directions. EMR is an inherent problem in designing high speed circuits. It causes electro-magnetic interference (EMI) in surrounding electronic systems which often causes malfunctions to occur in those surrounding systems. Accordingly, numerous EMR emission standards have been established by governmental regulatory agencies setting limits on the amount of unintentional radiated and conducted energy from electronic systems. Such standards vary depending upon the type of electronic system, the environment of use and various other factors.

It is well known that if the source of EM radiation cannot be eliminated or removed from close proximity to electronic pans that may act as receptors, the only sure way to prevent the unwanted electro-magnetic interference (EMI) is by shielding the radiator, the receptor or a combination of both. Basically EM shielding suppresses the radiated energy by covering the radiator or the receptor with an electrically conductive material. The shield should be well grounded to prevent reradiating the energy. In the case of a coaxial cable, the shielding takes the form of a metallic braid wound on top of an insulator. In the case of a computer system, the shielding takes the form of a closed metallic cabinet which houses and provides mechanical support for the computer circuit boards. Access doors are a problem for shielded enclosures, since they usually offer possible leakage paths to high frequency signals. Some such cabinets have no access doors at all and are often to remain sealed to eliminate the technical problem of preventing EMR from leaking out of the enclosure. Such designs obviously make maintenance a difficult problem in itself and are usually impractical for the end users. Whether there are access doors or not, mechanical designers trying to reduce unwanted radiation leaks usually focus their attention on minimizing gaps or any other openings.

There are hundreds of patents and even more technical papers that depict different types of EM shields, seams that electrically seal, EMI clips, EM compression gaskets, foil strips, blade-like access door flanges, electrically conductive tapes and paints, and other tricks all directed to containing EM radiation to within desired limits. For example, U.S. Pat. No. 5,223,670 depicts a rather involved hinge mechanism designed to open and close an access door of an EM shielded cabinet. Such exotic techniques all tend to drive up the fabrication costs of the electronic systems being built and necessarily decrease their utility.

This invention is directed to a very inexpensive EMR shielded hinge design particularly useful on access doors of metallic cabinets for electronic systems.

A principal object of this invention is the provision of a simple hinge having an integral EMR shield.

SUMMARY OF THE INVENTION

In accordance with the teachings of the present invention, these and other objectives are achieved through a novel EM shielded metallic enclosure having a plurality of side panels and at least one access door hinged to one of the side panels by a plurality of hinges. Each such hinge has three principal elements: a metallic tab, an elongated slot for receiving and supporting the metallic tab, and a raised metal arch bridging the central portion of the elongated slot. The metallic tab is formed as a part of one edge of the access door and extends from the edge at an acute angle. The metallic tab is preferably bent at the door-tab interface at a first acute angle $\alpha$ relative to the extended plane of the access door. The metallic tab is also bent at a different location at an acute angle $-\alpha$ so that the unconnected end portion of the tab is substantially parallel to the plane of the access door. The metallic tab is designed to slide into an elongated slot located in an adjacent side panel to provide support for pivoting the metallic tab and the connected door in a hinged relationship. To prevent EMR from otherwise leaking through the slot, a raised metal arch is provided on the interior of the enclosure and bridging the central portion of the elongated slot. The raised arch is spaced apart from the inner surface of the side panel to permit the free end of the metallic tab to freely rotate when the access door is swung open and closed. The arch forms an electromagnetic shield to radiation otherwise leaking through the elongated slot.

BRIEF DESCRIPTION OF THE DRAWINGS

For a better understanding of the invention as well as other objects and further features thereof, reference is made to the accompanying drawings wherein:

FIG. 6 is a plan view of a portion of the hinge shown in FIGS. 2 and 3 prior to forming the shield portion of the hinge.

DETAILED DESCRIPTION

Figure 1:
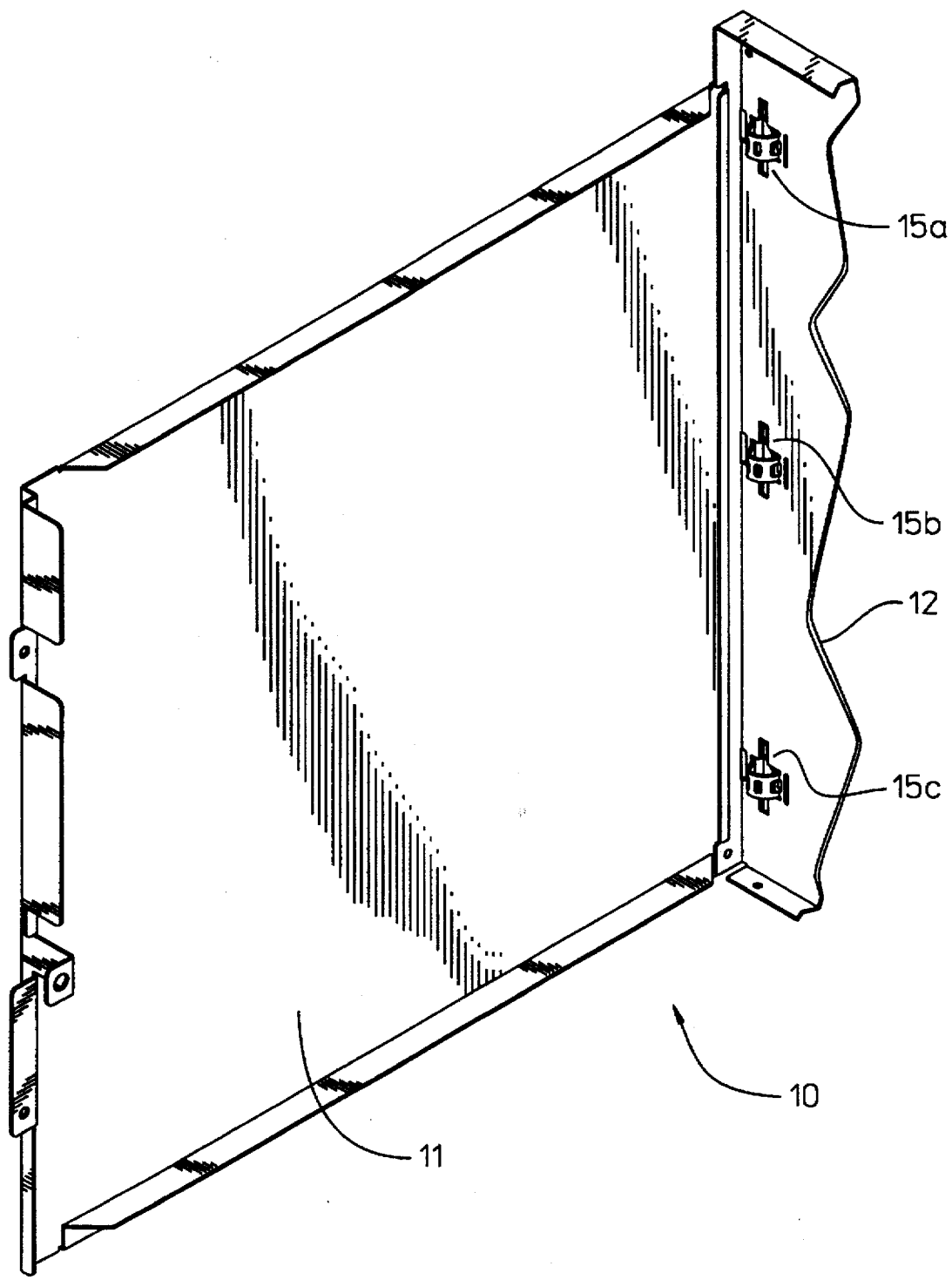
FIG. 1 is a perspective view of a portion of a metallic cabinet having a hinged access door which embodies the present invention.

For a better understanding of the subject invention, reference is made to the following description and to the above-described drawings. FIG. 1 depicts a portion of a metallic cabinet 10 which is suitable for housing and enclosing the electronic circuitry of, for example, a personal computer. FIG. 1 also depicts access door 11 and a portion of side panel 12 to illustrate the preferred embodiment of the present invention. Each side panel is preferably made of sheet metal formed with various flanges for added strength and EM sealing; however, such flanges do not form a part of the present invention. Access door 11 also doubles as a side panel to cabinet 10 and is movably mounted with respect to cabinet 10 with a set of three hinges 15a, 15b, and 15c as shown. FIG. 1 shows the access door 11 in a closed position relative to cabinet 10 and side panel 12, i.e., access door 11 and side panel 12 form a right angle at their intersection. In the closed position door 11 must be sealed to EMR emanating from within cabinet 10. (The term "sealed" in the context of shielding EMR more precisely means substantially suppressing radiated signals.)

Figure 2:
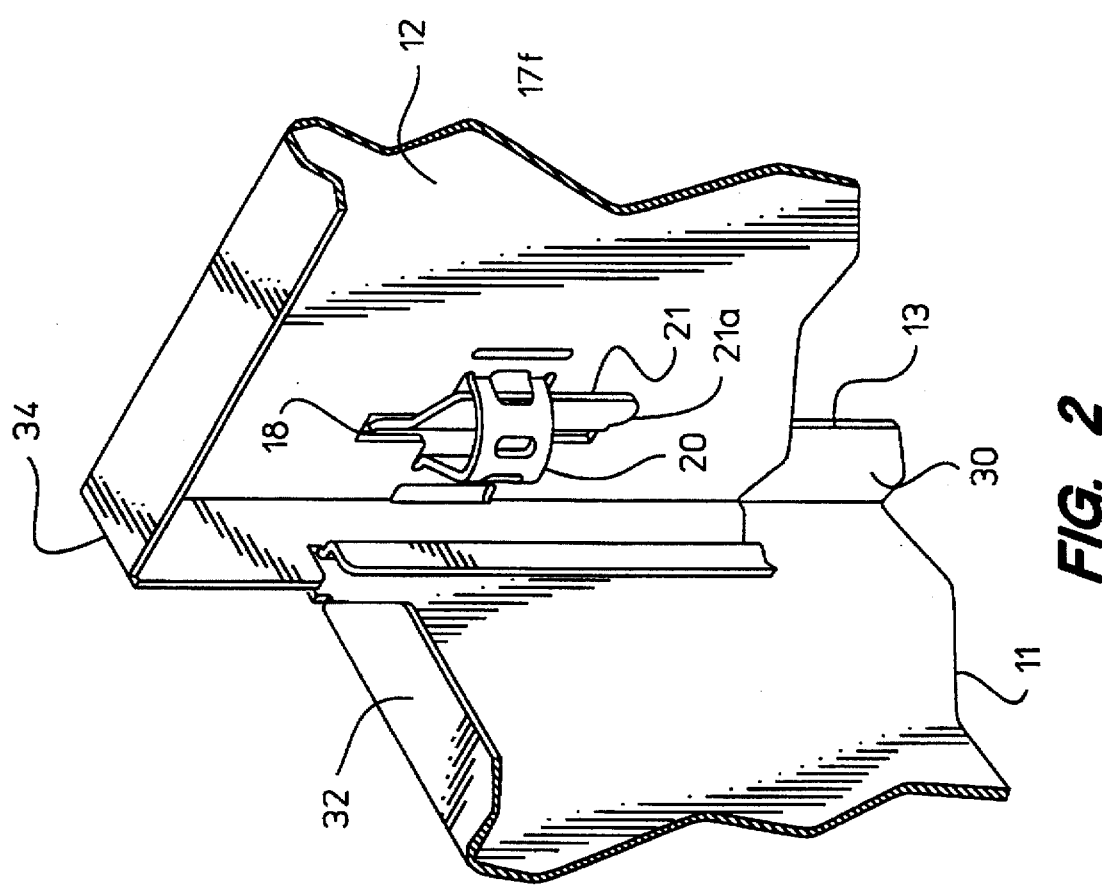
FIG. 2 is a close-up perspective view of the hinge portion of a metallic cabinet with the access door in/a closed position.
Figure 3:
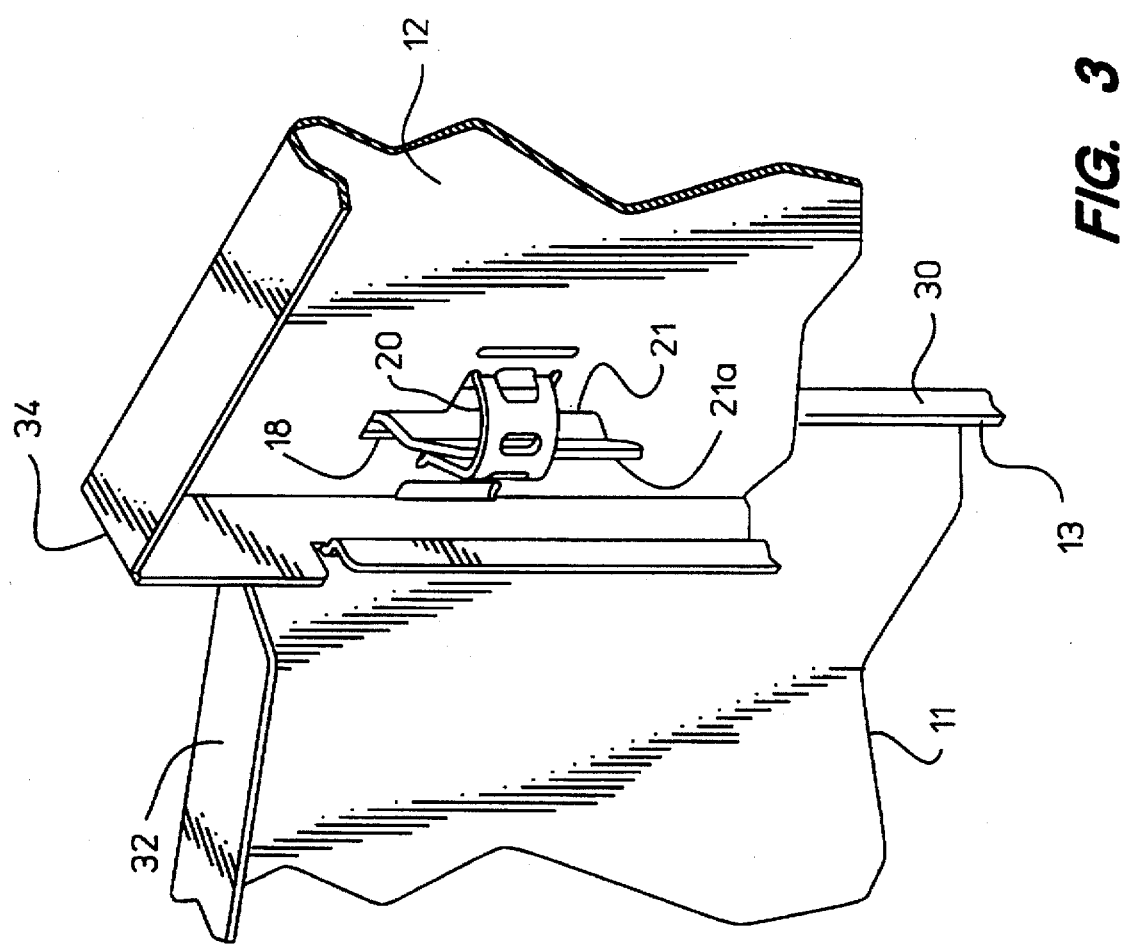
FIG. 3 is a close-up perspective view of the hinge portion of a metallic cabinet with the access door in an open position.
Figure 4:
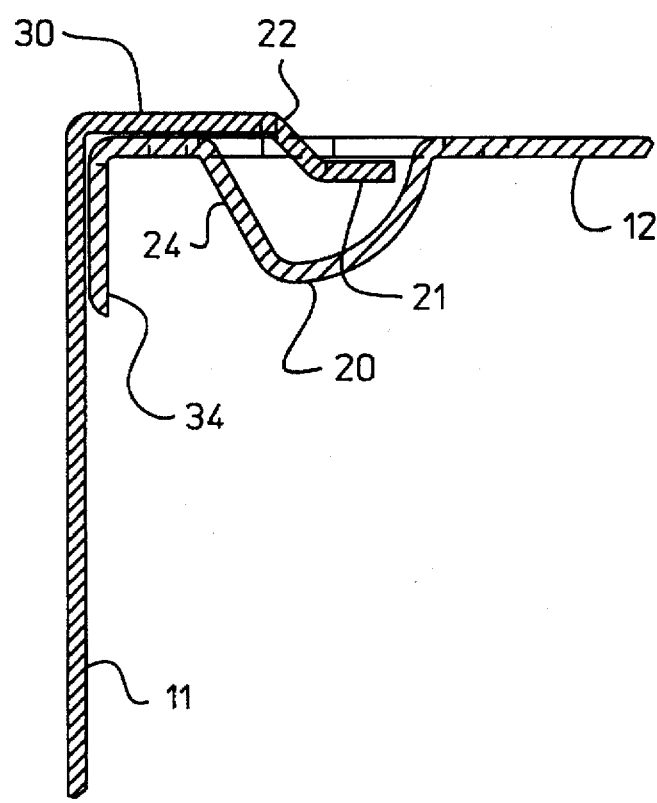
FIG. 4 is a sectional view of the hinge portion of a metallic cabinet with the access door in a closed position.
Figure 5:
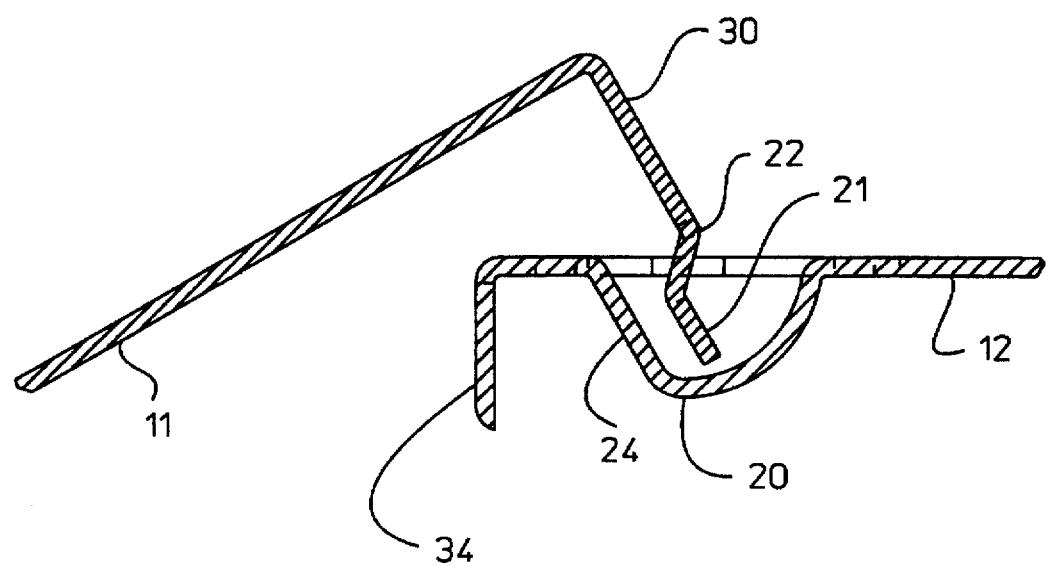
FIG. 5 is a sectional view of the hinge portion of a metallic cabinet with the access door in an open position.

FIGS. 2 and 3 show greater detail of the basic hinge design wherein all numerals shown correspond to those elements previously described in related figures. FIG. 2 depicts hinge 15a with access door 11 in a closed position, whereas FIG. 3 depicts the same hinge 15a with access door 11 in a partially open position. An essential part of hinge 15a is tab 21 which is integrally formed as a part of access door 11. Tab 21 extends outward on edge 13 of access door 11 and is preferably formed during the initial fabrication of the door. During initial fabrication of the door, tab 21 is bent inwardly as shown in the figure at the door-tab interface at an acute angle α (approximately 45° as shown) from the plane of access door 11 (or more precisely the plane of flange 30). Because access door 11 and side panel 12 are at right angles in the embodiment shown, tab 21 protrudes from the edge 13 of flange 30 which is an integral part of door 11. As should be obvious access door 11 and side panel 12 could be easily designed to be flush with each other, i.e., substantially in the same plane, by simply removing the flange 30. In the perspective of FIGS. 2 and 3 the door-tab interface 22 is not shown since it lies beneath side panel 12, but it is shown in the sectional views of FIGS. 4 and 5. The unconnected end portion of tab 21 is bent back at substantially the same acute angle α, but in the opposite direction of the first acute angle, thereby causing the unconnected end portion of tab 21 to be substantially parallel to the plane of flange 30 of access door 11. Tab 21 inserts into a substantially rectangular elongated slot 18 in side panel 12. Slot 18 provides support for pivoting tab 21 in a hinged relationship therewith. FIGS. 2 and 4 show the position of tab 21 engaging slot 18 in side panel 12 when door 11 is in a fully closed position. Whereas FIGS. 3 and 5 show the position of tab 21 engaging slot 18 in side panel 12 when door 11 is in a partially open position. Notice that the pair of bends in tab 21 advantageously cause most of the overlapping surfaces of door 11, flange 30 and tab 21 to be in close contact with side panel 12 and flange 34 when hinge 15a is in the closed position. This is best illustrated in FIG. 4. By closing off any openings in the hinge assembly, EMR leaking through the hinge is thus minimized.

Other aspects of tab 21 need to be mentioned to fully appreciate the functioning of hinge 15a as shown in the figures. The unconnected end or outermost portion of tab 21 acts as a door stop, in that it prevents door 11 from travelling beyond the position of normal closure, since tab 21 abuts the inner wall portion of side panel 12 adjacent to slot 18 when door 11 is fully closed (as is best shown in FIG. 4). As is best illustrated in FIG. 5, when door 11 is partially opened, tab 21 pivots in a sliding relationship about a pivot point located at the bottom of elongated slot 18 to cause access door 11 to rotate from a closed position to an open position. In the open position, depicted in FIGS. 3 and 5, tab 21 and door 11 could disengage allowing access door 11 and tab 21 to slide out of slot 18 were it not for a slight rounded extension 21a of the tab at the lower portion thereof as shown. An extension of tab 21 of a few millimeters is sufficient, when more than one hinge is used per door, to prevent the tab and access door 11 from disengaging from slot 18 and side panel 12. The rounded extension 21a creates a notch between the outermost portion of tab 21 and the side edge of access door 11. When tab 21 is initially inserted into slot 18, the weight of door 11 causes the rounded extension 21a to drop below (as shown) the opening of slot 18 so that the notch rests on the bottom surface 18b of slot 18. In addition to facilitating the initial insertion of the tab 21 into slot 18, the upper most portion of tab 21 (opposite extension 21a) is tapered to narrow the outermost unconnected free end of tab 21. Although the hinge would certainly function without the upper tapering of tab 21, it does make installing the door 11 into hinges 15 a somewhat easier task. Such tapering also permits the length of slot 18 to be somewhat shorter than what would otherwise be required. This is advantageous since the length of slot 18 determines the longest wavelength of EM radiation that can leak through the slot; the shorter the slot, the higher frequency the EM signals have to be to escape.

An important part of the shield hinge assembly is the raised metal arch 20 shown in FIGS. 2–6. The raised metal arch 20 extends inwardly from side panel 12 so as to bridge the central portion of slot 18 while providing sufficient clearance to allow tab 21 to freely rotate when access door 11 is opened and closed. This is evident from a comparison of the tab positions when the door is closed (FIG. 4) with the tab position when the door is opened (FIG. 5). As door 11 is opened, the outermost portion of tab 21 describes an arc similar in shape to the contour of arch 20 shown in FIGS. 4 and 5. The purpose of arch 20 is to form an electro-magnetic shield to radiation otherwise leaking through slot 18. By electro-magnetically breaking up the central portion of the elongated slot 18, it causes slot 18 to electrically appear as two very short openings so that the wavelength of the leakage signal must be very short to leak through the ends of slot 18. Such high frequency signals are beyond the range of present day pc components. Thus, EMR leakage through these hinge assemblies 15 is significantly suppressed.

Referring to FIG. 6, the hole/slot pattern punched in that portion of the side panel 12 that forms shield 20 is shown prior to forming shield 20 above slot 18. Six slots are punched, 17a–17f, in panel 12 to facilitate stamping arch 20 into place over that portion of the sheet metal that will become the central portion of slot 18. Slots 17a–17f weaken the structural integrity to allow the sheet metal to stretch into shape when stamped into the final shape of arch 20 as shown in FIGS. 2 and 3. Slots 17a and 17f are intentionally made larger than slots 17b, 17c, 17d, and 17e so that the ends of arch 20 will stretch more than the center portion of the arch. It should be noted that after stamping the arch 20 into the arcuate shape depicted in FIGS. 2 and 3, slots 17a and 17f become slightly distorted from the stretching of the metal surround the slot. This is a practical consequence that does not affect the operation of the invention described. In addition, all these additional slots (17a–17f) are smaller than the electro-magnetic "hole" produced by the end portions 18a and 18b of slot 18.

Note also that the shape of arch 20 is not completely circular. That portion of arch 20 marked with numeral 24 in FIGS. 4 and 5 is relatively flat. The purpose of flat 24 is to provide a second stop for tab 21 to limit movement of access door 11 in the open position. If access door 11 is opened a full 90° from the closed position shown in FIGS. 2 and 4, the end of tab 21 will abut flat 24 preventing access door 11 from being opened any further.

It will be equally apparent to those skilled in the art that many modifications and changes may be made and still be within the spirit of the invention.

Accordingly, the disclosure of the present invention is intended to be illustrative, but not limiting, of the scope of the invention, which is set forth in the following claims.

What is claimed is:

1. An EM shielded hinge structure for hinging a metallic access door to a metallic cabinet having a plurality of side panels, said hinge structure comprising:

a hinge tab extending from and integral with one side edge of said access door, said tab having a lower edge, an upper edge and an outer edge, said tab being bent at a first acute angle from the plane of the door, and a portion of said tab lower edge extending outwardly, thereby forming a notch between said tab and said one side edge of said access door; and tab receiving means located in one of said side panels for receiving said hinge tab and for providing support for pivoting said hinge tab in a hinged relationship therewith, said tab receiving means including a first elongated slot in siad one side panels having a slot length coextensive with the length of said tab outer edge, said tab receiving means also including a raised metal arch extending inwardly from and integral with said side panel and bridging the central portion of said slot, said raised arch spaced apart from the surface of said side panel to permit said tab outer edge to freely rotate when said access door is swung open and closed, said arch forming an electro-magnetic shield to radiation otherwise leaking through said elongated slot.

2. An EM shielded hinge structure as defined in claim 1 wherein said raised metal arch further comprises:

an arched strip of metal having a plurality of second elongated slots formed lateral to the longitudinal axis of said strip to facilitate forming said strip into said arch during fabrication thereof.

3. An EM shielded hinge structure as defined in claim 2 wherein said plurality of second elongated slots are evenly spaced along said longitudinal axis.

4. An EM shielded hinge structure as defined in claim 3 wherein said arch is integrally formed from said one side panel by stamping a section of said one side panel prior to forming said first elongated slot.

5. An EM shielded hinge structure as defined in claim 4 wherein a lower inside edge of said first elongated slot and the upper inside edge of said notch are in sliding engagement for opening and closing said access door to said metallic cabinet.

6. An EM shielded hinge structure as defined in claim 5 wherein said hinge tab is bent at a second location closer to said tab outer edge and at substantially the same acute angle but in the opposite direction of said first acute angle thereby causing said tab outer edge to be substantially parallel to the plane of said access door.

7. An EM shielded hinge structure as defined in claim 6 wherein said different location is chosen to cause said end portion of said tab to be flush with the inside surface of said one side panel when said access door is in a closed position relative to said side panel.

8. An EM shielded hinge structure as defined in claim 7 wherein said arch is stamped prior to forming said first elongated slot thereby forming a third slot lateral to the location of said first elongated slot.

9. An EM shielded hinge structure as defined in claim 8 wherein said tab is tapered to facilitate insertion into said fast elongated slot.

10. An EM shielded hinge structure as defined in claim 9 wherein said first elongated slot is longer than said hinge tab.

11. An EM shielded hinge structure as defined in claim 10 wherein said metallic cabinet is made of sheet metal.

12. An EM shielded metallic enclosure having a plurality of side panels and at least one access door hinged to one of the side panels by a plurality of hinges, each hinge comprising:

a metallic tab member integral with one edge of said access door and extending therefrom at a first acute angle relative to the extended plane of said access door, said metallic tab member having an upper edge portion, a lower edge portion and a free end portion, said free end portion being bent at a second acute angle such that said free end portion of said metallic tab member is substantially parallel to the plane of said access door, said lower edge portion having a notch adjacent to said one edge of said access door; and tab receiving means provided on one of said side panels for receiving said metallic tab member and for providing support for pivoting said metallic tab member in a hinged relationship therewith, said tab receiving means including a first elongated rectangular slot having a slot length L suitable for receiving said free end portion of said metallic tab member, said tab receiving means also including:

a raised metal continuous arch extending inwardly from and integral with said one side panel and bridging the central portion of said elongated rectangular slot, said raised arch being spaced apart from the surface of said one side panel to permit said free end portion of said metallic tab member to freely rotate when said access door is swung open and closed, said arch having a width W and forming an electro-magnetic shield to radiation otherwise leaking through said elongated rectangular slot.

13. An EM shielded metallic enclosure as defined in claim 12 wherein said raised metal arch further comprises:

an arched strip of metal of width $W \geq 4/L$, said arched strip having a plurality of second elongated slots $<W$ in length and spaced lateral to the longitudinal axis of said strip to facilitate forming said arched strip into said arch during fabrication thereof.

14. An EM shielded metallic enclosure as defined in claim 13 wherein said arch is integrally formed from said one side panel by stamping a section of said one side panel prior to forming said first elongated rectangular slot.

15. An EM shielded metallic enclosure as defined in claim 14 wherein a lower inside edge of said first elongated rectangular slot and the inside edge of said notch are in sliding engagement for opening and closing said access door to said metallic enclosure.

16. An EM shielded metallic enclosure as defined in claim 15 wherein said arch is stamped prior to forming said first elongated rectangular slot thereby forming a third slot lateral to the location of said first elongated rectangular slot.

17. An EM shielded metallic enclosure as defined in claim 16 wherein said upper edge portion of said tab member is tapered to facilitate insertion of said tab member into said first elongated rectangular slot.

18. An EM shielded metallic enclosure as defined in claim 17 wherein said slot length L is longer than said free end portion of said metallic tab member.

19. An EM shielded metallic enclosure as defined in claim 18 wherein said plurality of hinges is 3.

20. An EM shielded metallic enclosure as defined in claim 19 wherein said metallic enclosure is made of sheet metal.

* * * * *